United States Patent
Meltzer et al.

(10) Patent No.: US 7,187,222 B2
(45) Date of Patent: Mar. 6, 2007

(54) CMOS MASTER/SLAVE FLIP-FLOP WITH INTEGRATED MULTIPLEXOR

(75) Inventors: David Meltzer, Wappinger Falls, NY (US); Muralikumar A. Padaparambil, Poughkeepsie, NY (US)

(73) Assignee: Seiko Epson Corporation, Tokyo (JP)

( * ) Notice: Subject to any disclaimer, the term of this patent is extended or adjusted under 35 U.S.C. 154(b) by 11 days.

(21) Appl. No.: 11/016,430

(22) Filed: Dec. 17, 2004

(65) Prior Publication Data

US 2006/0132209 A1    Jun. 22, 2006

(51) Int. Cl.
*H03K 3/289* (2006.01)
(52) U.S. Cl. .................... 327/202; 327/215
(58) Field of Classification Search .......... 327/202, 327/203
See application file for complete search history.

(56) References Cited

U.S. PATENT DOCUMENTS

| | | | |
|---|---|---|---|
| 5,574,731 A | 11/1996 | Qureshi | 714/726 |
| 5,748,009 A | 5/1998 | Bertolet et al. | 326/39 |
| 5,818,273 A | 10/1998 | Orgill et al. | 327/199 |
| 5,818,293 A * | 10/1998 | Brehmer et al. | 327/202 |
| 6,265,898 B1 * | 7/2001 | Bellaouar | 326/93 |
| 6,304,122 B1 * | 10/2001 | Gregor et al. | 327/202 |
| 6,496,030 B1 * | 12/2002 | Kaneko | 326/16 |
| 6,753,714 B2 * | 6/2004 | Gupta | 327/202 |
| 6,798,249 B2 | 9/2004 | Wong et al. | 326/115 |

* cited by examiner

*Primary Examiner*—Quan Tra
*Assistant Examiner*—Ryan Jager
(74) *Attorney, Agent, or Firm*—Rosalio Haro (57) ABSTRACT

A CML master-slave latch incorporates logic into its master latching circuitry to incorporate a multiplexing function into the flip-flop. The multiplexing logic makes use of the pull-up loads and current source of the master latching circuitry. In this manner the pull-up loads and current source typically required for a stand-alone multiplexor are eliminated. Subsequently, the size of the present hybrid master-slave latch is smaller and consumes less power than a traditional combination of an independent multiplexor and master-slave latch. Since the master latching circuitry feeds only into the slave latching circuitry, the pull-up loads and the current sources of the master latching circuitry and slave latching circuitry may be optimized separately for achieving faster performance or less power consumption.

7 Claims, 6 Drawing Sheets

CMOS MASTER/SLAVE FLIP-FLOP WITH INTEGRATED MULTIPLEXOR

BACKGROUND OF THE INVENTION

1. Field of the Invention

The present invention relates generally to a high speed flip-flops, and more specifically to high speed current mode flip-flops for use in communication systems.

2. Description of the Related Art

High speed flip-flops, or data latches, are key circuits in serial digital communications applications. The receiver of a high speed serial communication link typically pushes newly received data bits into a shift register, which is made up of many individually linked data latches. Although data is received serially, the internal core circuitry of a device typically manipulates data in bit groups of predefined size (i.e. byte, word, etc.). Therefore, when a predetermined number of latches in the shift register have received data, the received data in the shift register is typically output in parallel onto a bus for further processing. Similarly, when a transmitter is coupled to a serial communication link, a group of data bits is loaded in parallel into a shift register, and the loaded data is then serially shifted out one bit at a time onto the serial link via a signal output driver. Since registers, or latches, are an integral part of data reception and transmission operations, and since they need to operate at, or higher than, the transmission rate of the communication system, high speed latches, or flip-flops, are an integral part of any high speed communication system.

Thus in such communication systems, a high speed serial data stream is converted into a multi-bit parallel bus using multiple flip-flops configured such that the flip-flops are either used as a shift register or a parallel load/unload register. The dual operation, or configuration, where a multi-bit parallel bus is converted into a high speed serial data stream is just as frequently used since a typical bidirectional communication system is just as likely to transmit data as it is to receive it. Both of these register applications involve a multiplexor coupled to the data input of the flip-flop, or latch. This combination of multiplexor and flip-flop is thus very common in such communication applications. Additionally, since the speed of the flip-flop dictates how fast data can be received, or transmitted, typically the speed of this circuit limits the speed of the serial communication path.

The highest frequency of operation for this type of digital design can generally be achieved by using a differential current steering logic family, such as CMOS current mode logic, CML. Differential logic families typically use two leads to transmit two sub-signal components that together constitute a complete signal. That is, a differential signal consists of both the logic true and logic complement form of a signal carried on two separate leads. The signal information may be read by coupling the two leads to the inputs of a differential amplifier, which determines which of the two leads is at a higher potential. By discerning which of the two leads is at a higher potential, one can determine if the leads carry a logic high data signal or a logic low data signal. This is in contrast to traditional single-ended transmissions, which carry signal information on a single lead and data signal information is determined by checking the voltage level on the lead to resolve whether it is at a high enough potential to represent a first logic level or at a low enough potential to represent a second logic level. Since information on a differential signal is conveyed by setting one lead of a two-lead pair to a higher potential then the other, it is not necessary that the leads be raised or lowered to potential levels traditionally associated with a logic high or logic low signal in single-ended technology. Therefore, the voltage swings on a differential signal are much smaller, and thus much faster.

Although a differential signal requires two leads to represent one signal (a first lead to carry the logic true form of the signal and a second lead to carry the logic complement form of the signal), for the sake of brevity, part of the following discussion will reference only the differential signal (and not the two leads necessary for conveying the signal) when discussing differential communication systems, with the understanding that the one signal requires two leads for proper conveyance. Two sub-signal components, a true and a complement, will be used as necessary, when such use facilitates understanding of a particular feature. For now, it suffices to say that current mode logic is characteristically a differential signal technology.

Many configurations of current mode logic (CML) are known, and they are typically distinguished by the style of load device used and the number of current sources. Current mode logic, however operates on the concept of steering current; current steered one way produces a first logic level, and current steered another way produces second logic level. Since logic content is determined from the direction of current flow, current must necessarily be constantly flowing when a device is operational. As a result, CML circuitry, although fast, consumes more current and thus more power than static CMOS circuitry, which consumes current only during logic transitions. That is, CML topologies typically have inferior speed-to-power ratios than do static CMOS topologies, but offer a maximum operating frequency several times higher than static CMOS topologies. Therefore, CML is still preferred for very high frequency applications, such as high speed communication systems.

A compromise for obtaining high speed performance with reduced power requirements is to combine both CML and static CMOS technologies. The portions of a circuit that have the highest speed requirements are identified and implemented using a CML topology, and the remaining, slower portions of the circuit are implemented using a static CMOS topology. For example in the case of high speed communications, the portions with the highest speed requirements are implemented using current steering digital logic circuits, and the slower portions are implemented using static CMOS circuitry. In either case, the CML portion of the circuitry still places a large demand on power sources.

Therefore, any reduction in the power requirements of the current steering digital logic circuits would reduce the total power of the highest speed portion of a system, such as a serial communication system. As stated above in regards to serial communications systems, one the most commonly needed circuit components are high speed latch circuits and multiplexers since they are integral to reception and transmission operations. Thus, the need for reducing the power requirements of high speed latch circuits and multiplexors in CMOS CML devices is self evident. Lower power CML latch circuits and multiplexers would increase the operating frequency of high speed serial communications systems while reducing their total power requirements.

Figure 1:
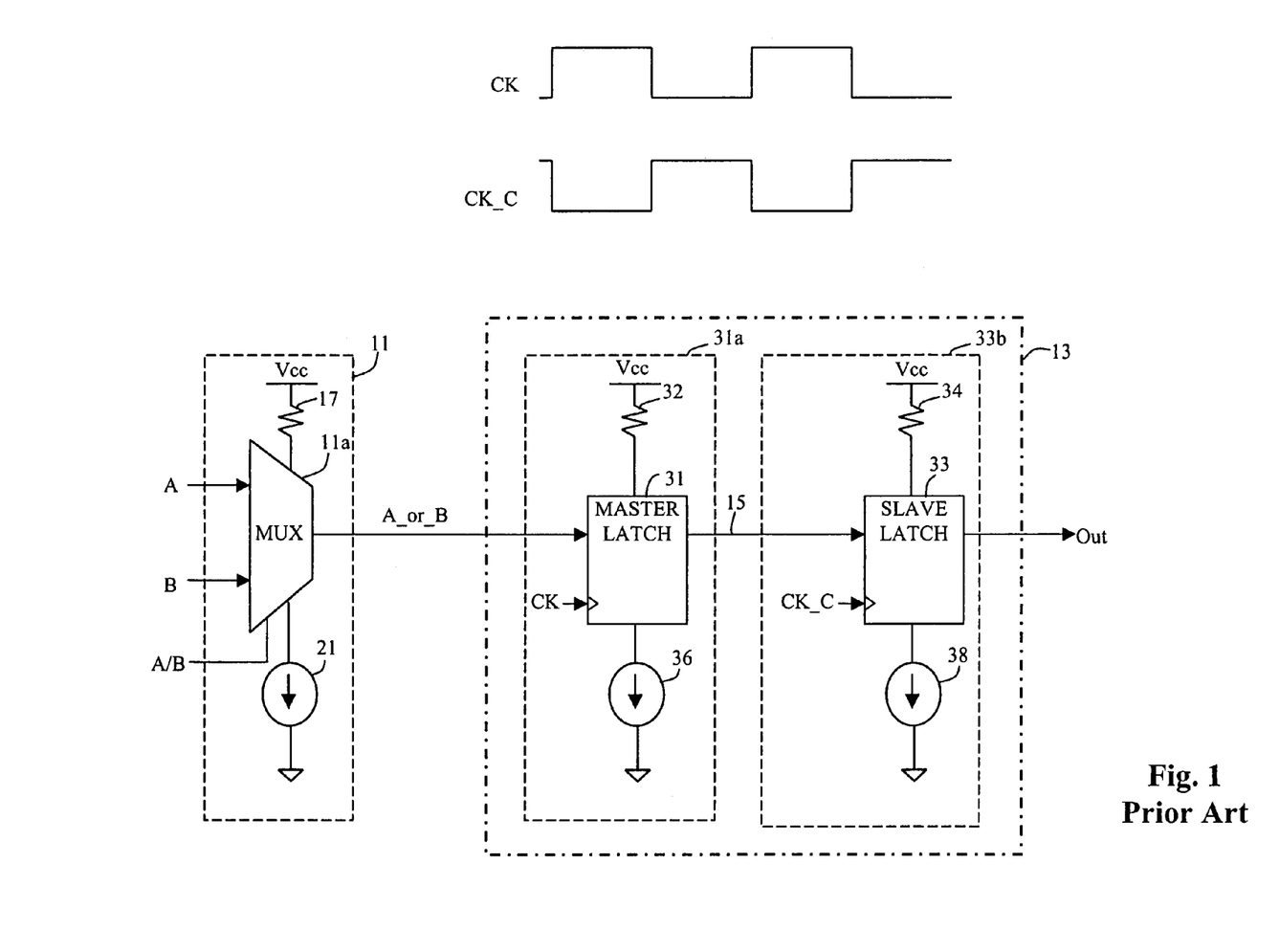
FIG. 1 is a block diagram of an typical CML multiplexor separate and independent from a typical CML master-slave latch.

One type of latch most commonly used in communication systems is the master-slave latch, which is comprised of two separately clocked latches, or flip-flops. With reference to FIG. 1, a multiplexor, MUX, 11 selects from among two independent signals A and B, in accordance with a selection input A/B, and the selected input signal A_or_B is passed to master-slave latch 13, which is comprised of a master latch 31$a$ and a slave latch 33$b$. In the present example, it is assumed that MUX 11 and master-slave latch 13 are both implemented in CML technology. Therefore, although only one signal line is shown for the sake of clarity, it is to be understood that each signal line is comprised of two sub-signal components on two leads. Thus, both signal A and signal B consist of two separate leads, each carrying respective true and complement sub-signal components. Similarly, signal A_or_B coupling MUX 11 to master-slave latch 13 should be understood to consist of two leads, a true A_or_B sub-signal component and a complement A_or_B sub-signal component. Likewise intermediate signal 15 and output signal Out also consist of two leads carrying complementary sub-signal components.

In the present example, only features of interest of a CML implementation are shown. A more detailed view of a CML based latch can be found in U.S. Pat. No. 6,798,249 to Wong et al. In the present case, it suffices to point out that a key feature of a CML topology is the use of a pull-up load and a current source. For example, load 17 couples CML switching MUX circuit 11a to Vcc, and CML switching MUX circuit 11a is supplied current by current source 21. Similarly, master latch 31a includes load 32 and current source 36, and slave latch 33b includes load 34 and current source 38. Information is conveyed by the direction in which current supplied by a respective current source is steered within an individual CML switching circuit.

For example, information regarding whether signal A or signal B is conveyed to output A_or_B is determined by the path the current from current source 21 takes within MUX 11.

Typically, each CML device component has its own pull-up load and its own current source. Of particular interest is that a typical master-slave latch typically includes two latches 31a and 33a. The first latch 31a includes what is typically designated a master latch 31 since it typically latches data during the first phase of a clock cycle. The second latch 33a includes what is typically designated a slave latch 33 since it typically latches data during the second phase of the clock cycle and its data contents are dictated by the master latch 31. Since a typical master-slave latch 13 includes two separate latches, 31a and 33b, each of the two latches has a respective pull-up load 32 and 34, and a respective current source 36 and 38. Since both latches 31a and 33b typically have identical latch architecture, the values of pull-up loads 32 and 34 are typically equal, and the magnitudes of the current provided by current sources 36 and 38 are the same. A basic difference between latch 31a and 33b is that each is responsive to opposite phases of the clock signal.

In the present example, the master latch 31 is responsive to the true clock signal, CK, and the slave latch 33 is responsive to the complement clock signal CK_C. In this manner, it is assured that a first latch, either 31 or 33, latches in data during a first half of the clock (i.e. a first phase of the clock) while the second latch maintains its current output constant, and the second latch latches in new data (output of the first latch) during a second half of the clock (i.e. a second phase of the clock) while the first latch maintains it current output constant.

Therefore in the present example, when signal CK goes high, master latch 31 responds by accepting whatever data is on signal A_or_B and conveying the accepted data to its intermediate output 15. Although intermediate output 15 is coupled to the input of slave latch 33, slave latch 33 is not affected by changes on intermediate output 15 since the complementary clock, CK_C, is low and slave latch 33 therefore maintains its output constant and does not accept new input data.

When clock signal CK goes low and complementary clock signal CK_C goes high, master latch 31 responds by latching in and holding its intermediate output 15 steady at the same logic value as when clock signal CK went low. Any further changes in signal A_or_B while signal CK is low are ignored by master latch 31. Conversely, when signal CK went low, complementary signal CK_C went high causing slave latch 33 to begin accepting input data on intermediate output 15 and conveying the accepted data to its output signal, Out. Upon signal CK returning high, complementary signal CK_C goes low causing slave latch 33 to latch and hold the output data level at the time when complementary signal CK_C went low. In this way, master latch 31 can accept new data while slave latch 33 holds current data steady until it is time to update the output of slave latch 33.

OBJECTS OF THE INVENTION

The present invention is directed to solving these problems.

An object of the present invention is to provide a flip-flop circuit with reduced power requirements.

Another object of the present invention is to provide a flip-flop circuit with a built-in multiplexing function and configurable for reduce power consumption and/or faster performance.

SUMMARY OF THE INVENTION

These objects are met in a hybrid flip-flop, or register, that incorporates a multiplexing function. Preferably, the flip-flop is implemented as a master-slave flip-flop, or latch, which includes a master latch and a slave latch each operating at opposite phases of a clock. However, power saving features of the present invention may be incorporated into other types of flip-flops, such as a data flip-flop (i.e. a D-latch), SR flip-flop, JK flip-flop, etc. A main feature of the present invention is that the hybrid flip-flop in accord with the present invention incorporates a multiplexing function while reducing the number of components that would be needed for constructing a stand-along multiplexor separate, and independent, from a flip-flop.

Another feature of the present invention, when implemented in a current mode logic, CML, topology, is that it reduces the total number of required current sources as compared to the construction of a stand-along multiplexor separate, and independent, from a flip-flop.

The present hybrid flip-flop preferably has at least a first data signal input, a second data signal input, a signal select input for selecting among the first and second data signal inputs, a clock input, and a data output. If the signal select input is made to select the first data signal input, then the present hybrid flip-flop operates as a traditional single-input flip-flop by latching in data on the first data input signal in accordance to its clock input, while ignoring any data on the second data input signal. Conversely, if the signal select input is made to select the second data signal input, then the present hybrid flip-flop operates as a traditional single-input flip-flop by latching in data on the second data input signal in accordance to its clock input, while ignoring any data on the first data input signal.

That is, present hybrid flip-flop may include a latching circuit, which may consist of two cross-coupled inverters, responding to the clock input and augmented by a logic block that receives the first data signal input, second data signal input, and signal select input. Preferably, the logic block outputs a logic high only if the first data input signal is high and the signal select input selects the first data input signal, or if the second data input signal is high and the signal select input selects the second data input signal. The output of the logic block is passed to the input of the latching circuit. As it is known, a traditional multiplexor typically behaves as a coupling device for selectively coupling one of multiple inputs to an output in accordance to a select signal. That is, the selected input signal is traditionally routed within the multiplexor to the multiplexer's output. By contrast, the present logic block does not route either of its first or second data input signals to its output, but instead outputs a logic high only under two circumstances, as explained immediately above. This simplified operation definition facilitates its implementation, as explained below.

The present invention is well suited for implementation in a current mode logic, CML, topology. Specifically, the latching circuit preferably consists of at least two cross-coupled inverters (having pull-up loads and cross-coupled transistors), and being effective for steering current from a current source. Preferably, the logic block is incorporated into this latching circuit, and makes use of the latching circuit's pull-up loads and current source. Further preferably, the logic block consists of a true logic sub-block and complementary logic sub-block to provide a true and complement signal input to the CML latching circuit.

The true logic sub-block preferably includes two sets of two series-connected transistors, with both sets coupled in parallel across a first of the cross-coupled transistors of the latching circuit. The two transistors of the first set of series-connected transistors are preferably, respectively responsive the first data signal input and to a select signal that indicates if the first data signal input is currently selected. The two transistors of the second set of series-connected transistors are preferably, respectively responsive the second data signal input and to a select signal that indicates if the second data signal input is currently selected.

The complementary sub-block preferably includes a first pair of parallel-connected transistors in series with a second pair of parallel-connected transistors. The complementary sub-block is preferably coupled in parallel across a second of the cross-coupled transistors of the latching circuit. The two transistors of the first pair of parallel-connected transistors are preferably, respectively responsive the complement of the first data signal input and to the complement of the select signal that indicates if the first data signal input is currently selected. The two transistors of the second pair of parallel-connected transistors are preferably, respectively responsive the complement of the second data signal input and to the complement of the select signal that indicates if the second data signal input is currently selected.

In this manner, the true and complement sub-blocks of the logic block share the same pull-up loads and current source as the latching circuit of the CML flip-flop. This results in the elimination of the current source typically needed for a stand-alone multiplexor, which not only reduces real-estate requirements, but also reduces power consumption. Additionally, the number of switching devices is reduced, which further reduces power consumption.

Further preferably, the flip-flop is of the master-slave type, and therefore includes a second latching circuit. The latching circuit described above that incorporates the multiplexing function is preferably designated the master latch, and the second latching circuit is preferably designated the slave latch. A pair of transfer devices, i.e. pass devices, amplifiers, or inverting amplifiers, are used to selectively couple the output of the master latch to the slave latch in accordance with a clocking signal.

In the presently preferred embodiment; the logic block, master latching circuit, transfer devices, and slave latching circuit are selectively enabled and disabled by being coupled to, and decoupled from, current sources in accordance with a clock signal. Specifically, the logic block and the slave latching circuit are activated and deactivated in unison by the complement of a true clock signal. As explained above, the logic block is selectively coupled to the current source (i.e. first current source) that feeds the master latching circuit. In the preferred embodiment, the slave latching circuit includes second pull-up loads, second cross-coupled transistors, and a second current source. Preferably when the complement of the true clock is high, the logic block is coupled to the first current source and the slave latching circuit is coupled to the second current source. During this time, the master latching circuit is decoupled from the first current source and the transfer devices are decoupled from the second current source. In this manner, the master latching circuit and transfer devices are deactivated while the logic block and slave latching circuit are activated.

When the true clock signal is high, the master latching circuit is coupled to the first current source and the transfer devices are coupled to the second current source. During this time, the logic block is decoupled from the first current source and the slave latching circuit is decoupled from the second current source. In this manner, the master latching circuit and transfer devices are activated while the logic block and slave latching circuit are deactivated.

Further preferably, when the slave latching circuit is deactivated, it preferably acts as a pass device for passing the output from the transfer devices directly to the output of the present master-slave latch.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Preferred embodiments of the present invention are described below with reference to the accompanying figures.

Power requirements in a current steering logic applications, such as current mode logic, CML, is dependent on the number of the current sources used and the magnitude of each current source. As it would be understood, the current sources provide the current that it steered within the CML switch circuitry to convey information. Power requirements are further dependent on the total capacitance of the switching devices (typically transistors) used to steer the current. Typically, the total capacitance of the switching devices is dependent on both the size and number of switches used. The present invention is particularly well suited for, but not limited to, reducing power requirements in a CML latch and multiplexor by addressing these two sources of power consumption.

The present invention takes advantage of the observation that a multiplexer is often used in combination with a master-slave latch in high speed communication systems. Therefore, the present invention seeks to present a hybrid circuit incorporating the functionality of a multiplexer into a master-slave latch, and thus eliminate much of the circuitry associated with a stand-alone multiplexor. This reduction in circuitry directly leads to a reduction in power consumption since the number of switching devices and other components is reduced. Moreover, the resultant hybrid circuit provides additional options for speed versus power optimization, as will be explained more fully below.

Figure 2:
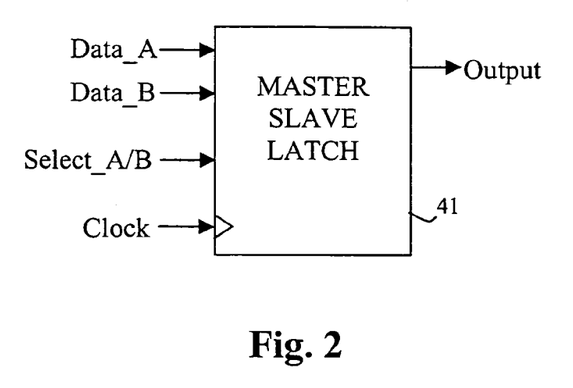
FIG. 2 is logic block configuration of a hybrid flip-flop in accord with the present invention.

With reference to FIG. 2, the present invention incorporates the functionality of a multiplexor into a power-optimized, master-slave latch 41. That is, a master-slave latch 41 in accord with the present invention has two data signal inputs (Data_A and Data_B), a Select_A/B control signal for selecting among inputs Data_A and Data_B, a Clock input for providing a clock signal, and an data signal output, Output. Preferably if control input Select_A/B is high, then data input Data_A is accepted by latch 41 and input Data_B is ignored. In this case, latch 41 would operate as a traditional master-slave latch with Data_A being its sole active data input. Conversely, if control input Select_A/B is low, then input Data_B is accepted by latch 41 and input Data_A is ignored. In this case, latch 41 would operate as traditional master-slave latch with Data_B being its sole active data input.

In FIG. 2, master-slave latch 41 is shown as a single-ended device (i.e. data signals Data_A, Data_B, and Output are shown on single leads), but it is to be understood that if master-slave latch 41 were implemented in a current steering technology, such as CML, then signals Data_A, Data_B and Output would all require two complementary signal leads to carry their true and complement signal information. In other words, if master-slave latch 41 is implemented in CML technology, then it necessarily has two sets of differential inputs (one for each of signals Data_A and Data_B, respectively) and one set of differential output leads (for signal Output), as shown below.

By incorporating a multiplexing function into master-slave latch 41, the present invention reduces the total number of switches and other component devices traditionally needed to construct a multiplexor and master-slave latch separately. Power requirements are further reduced by placing a few restrictions on some of the circuit components making up hybrid master-slave latch 41, as explained below.

Figure 3:
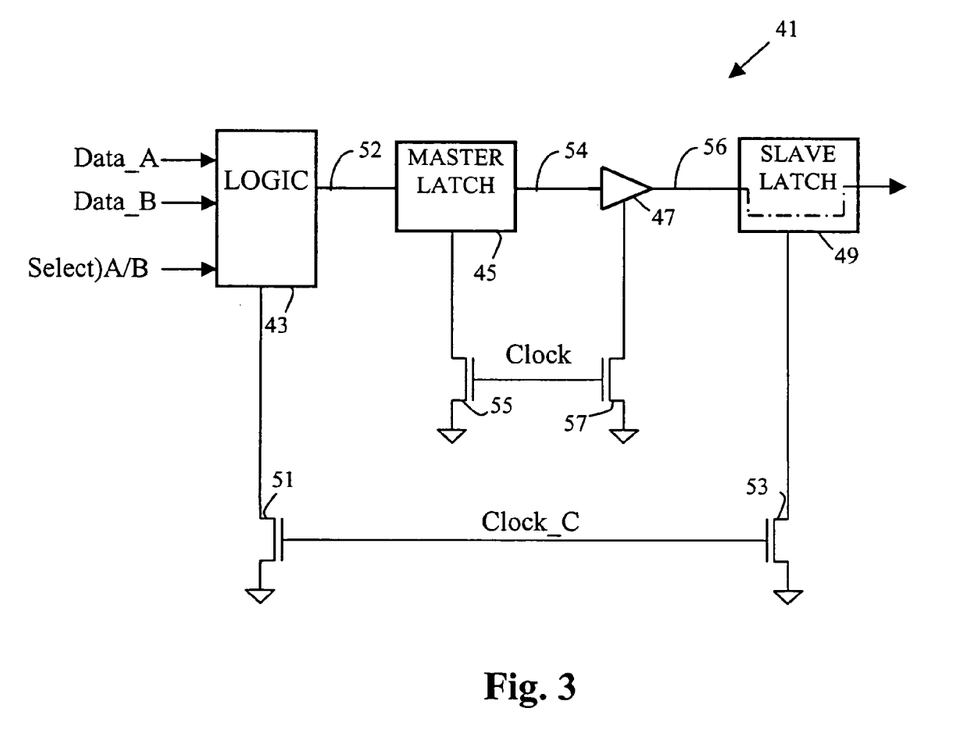
FIG. 3 is a block diagram of a hybrid flip-flop in accord with the present invention.

With reference to FIG. 3, master-slave latch 41 preferably includes a logic component 43 whose output 52 is coupled directly to the input of a first latch 45 (i.e. a master latch). The output 54 of master latch 45 is selectively coupled to the input 56 of a second latch 49 (i.e. a slave latch) by means of a coupling device 47, such as a pass device or amplifier. In the present example, preferably each of circuit components 43, 45, 47, and 49 may selectively be placed in an active or inactive state by means of a clock signal, Clock, and its logic complement, Clock_C. When any of components 43, 45, 47, or 49 is in an inactive state, it is effectively turned off and no current passes through the component. To achieve this, signal Clock controls transistor switch devices 55 and 57, which selectively sever and restore a current path to ground and thereby effectively turn on and off master latch 45 and coupling device 47 in unison. Similarly, complementary clock signal Clock_C controls transistor switch devices 51 and 53 to selectively turn on and off logic block 43 and slave latch 49 in unison by severing and restoring their current path to ground. Thus, when logic block 43 and slave latch 49 are enabled, master latch 45 and coupling device 47 are disabled, and when master latch 45 and coupling device 47 are enabled, logic block 43 and slave latch 49 are disabled.

Logic block 43 receives signals Data_A, Data_B, and Select_A/B. When active, logic block 43 preferably outputs a logic high only when signal Data_A is high and signal Select_A/B selects signal Data_A, or when signal Data_B is high and signal Select_A/B selects signal Data_B. Thus, logic block 43 outputs a logic high only when either of these two conditions are met, and outputs a logic low otherwise, if it is in its active state. Although a multiplexer ideally couples (in a pass through manner) a selected input, from among multiple inputs, to its output, the operation of logic block 43 is sufficient to mimic the operation of a multiplexor with two independent signal inputs Data_A and Data_B. This reduced definition of the multiplexing function simplifies its implementation.

Upon becoming active, as determined by signal Clock, master latch 45 preferably immediately latches in the data on its input 52 and outputs the latched data onto its output 54. As stated above, coupling device 47 is active when master latch 45 is active and inactive when latch 45 is inactive. Therefore, while master latch 45 outputs valid data, coupling device 47 transfers the valid data onto input 56 of slave latch 49.

While master latch 45 and coupling device 47 are active (in accordance with signal Clock), slave latch 49 is inactive in accordance with complementary signal Clock_C. When inactive, slave latch 49 preferably behaves as a pass device permitting the valid data output from coupling device 47 to pass through to output signal, Output, as is represented by a dotted line coupling the input of slave latch 47 to its output. However, upon becoming active, as determined by signal Clock_C, slave latch 49 preferably immediately latches in the data at its input 56 and outputs the latched data to signal Output. Therefore, when slave latch 49 is inactive, signal Output is effectively driven by coupling device 47, and when slave latch 49 becomes active, slave latch 49 latches in the current output value of coupling device 47 and maintains the latched value on signal Output. Consequently, no logic transition occurs on signal Output in the transition from the point when coupling device 47 is active and slave latch 49 is inactive to the point when slave latch 49 is active and coupling device 47 is inactive.

By turning off any device not necessary for operation during opposite phases of the clock, the present invention further conserves power while providing a master-slave latch operation with incorporated multiplexor function.

In operation, when complementary signal Clock_C is high and true signal Clock is low, logic block 43 is active and master latch 45 is inactive. During this time, logic block 43 outputs a logic high or low depending on the logic values of signals Data_A, Data_B, and Select_A/B. Upon signal Clock_C transitioning low and signal Clock transitioning high, master latch 45 becomes active and latches in the data on line 52 prior to the information being lost. At this time, coupling device 47 also becomes active and it transfers the latched data from master latch 45 to input 56 of slave latch 49. At this point slave latch 49 is inactive, but as explained above, slave latch 49 preferably has the attribute of functioning as a pass device when it is inactive. Therefore, the output of coupling device 47 is passed directly to signal Output. Upon signal Clock transitioning low, and signal Clock_C transitioning high, Master latch 45 and coupling device 47 are turned off, but slave latch 49 is activated and it latches the data on input 56. Thus, slave latch 49 maintains constant and valid the data on signal Output, while logic block 43 accepts new input data.

Figure 4:
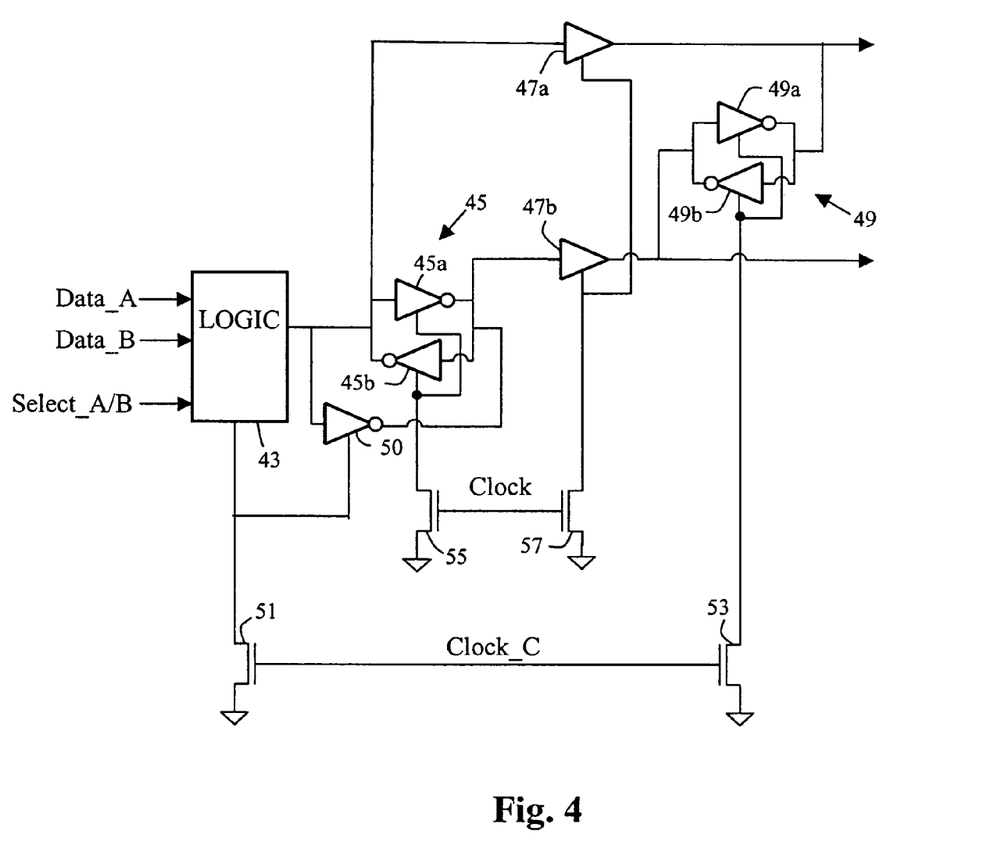
FIG. 4 is a more detailed block diagram of a hybrid flip-flop in accord with the present invention.

With reference to FIG. 4, a more detailed view of master latch 45 and slave latch 49 assumes that master-slave latch 41 is implemented in a differential mode. All elements in FIG. 4 similar to those of FIG. 3 have similar reference characters and are described above.

In the present case, master latch 45 is implemented as two cross-coupled inverters, 45a and 45b. This constitutes a basic latch wherein data is inputted by applying the true value of an input signal at the input of one inverter, i.e. 45a, and the logic complement of the input signal at the input of the second inverter, i.e. 45b. Similarly, slave latch 49 is comprised of two cross-coupled inverters 49a and 49b.

In the present example, the logic complement of the output from logic block 43 is obtained by inverter 50. Since both the true and complement outputs of logic block 43 should be enabled and disabled in accordance with signal Clock_C, inverter 50 is shown to also be responsive to switch transistor 51, and is enabled and disabled in accordance with signal Clock_C.

Cross-coupled inverters 45a and 45b inherently store a true and a complement version of latched data. Therefore, two coupling devices 47a and 47b, which together are representative of coupling device 47 of FIG. 3, couple the latched true and complement data from master latch 45 directly to the true and complement inputs of slave latch 49. As shown, the output of coupling devices 47a and 47b are coupled directly to the true and complement parts of the output leads, i.e. Output and Output_C. The true and complement outputs of slave latch 49 are also coupled to leads Output and Output_C. Therefore, when slave latch 49 is inactive (by virtue of signal Clock_C applying a logic low to switch device 53) and coupling devices 47a and 47b are both active (by virtue of signal Clock applying a logic high to switch device 57), coupling device 47a and 47b directly drive output leads Output and Output_C. When coupling devices 47a and 47b are inactive and slave latch 49 is active, the logic value on leads Output and Output_C is maintained valid by inverters 49a and 49b of slave latch 49.

Figure 5:
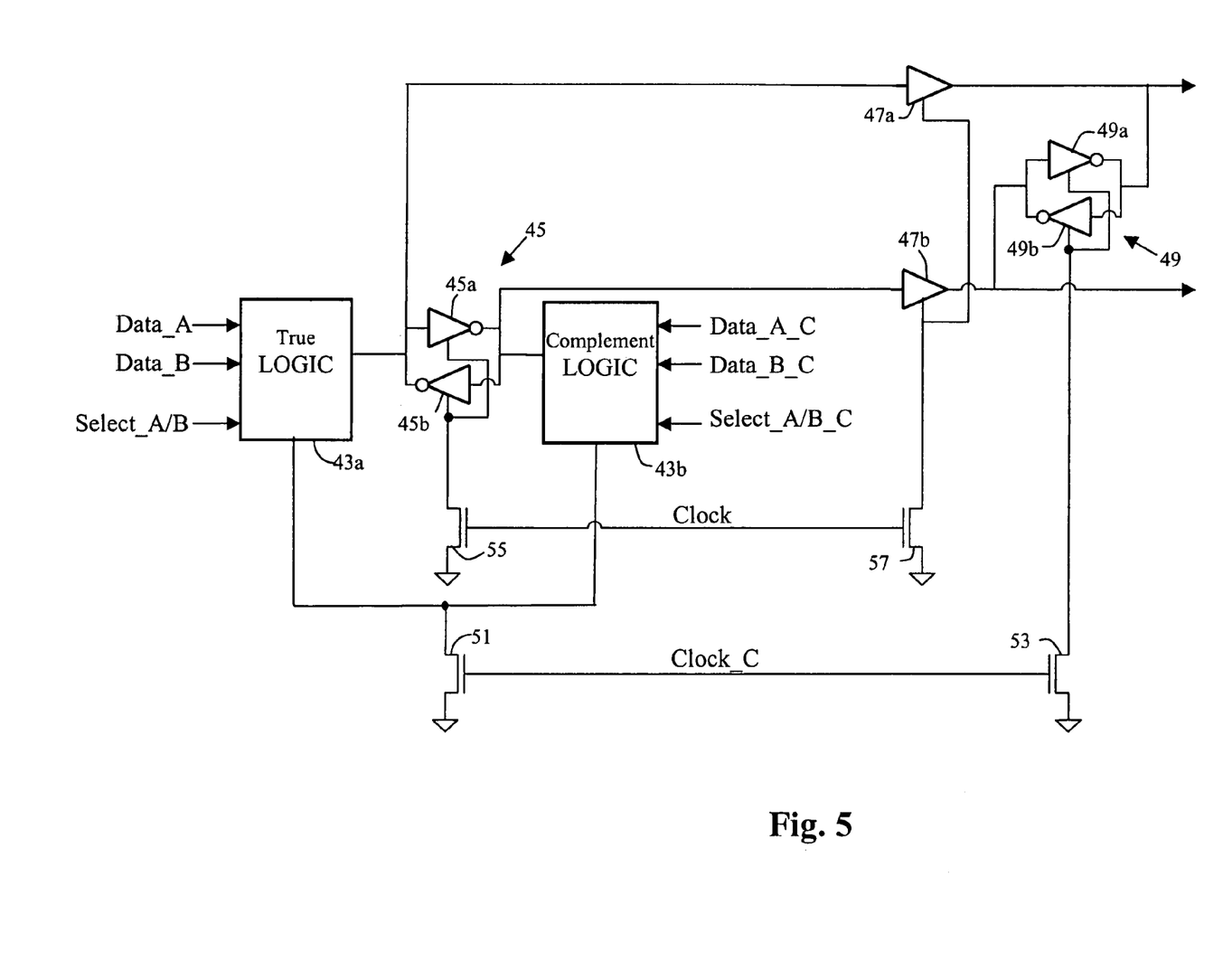
FIG. 5 is an alternate detailed block diagram of a preferred hybrid flip-flop in accord with the present invention.

Referring now to FIG. 5, it is preferred that logic block 43 be comprised of a true sub-block 43a and a complement sub-block 43b. In this case, inverter 50 of FIG. 4 is not needed since complement sub-block 43b ideally produces the logic complement of true logic block 43. Complement logic sub-block 43b receives as inputs complementary logic signals Data_A_C, Data_B_C, and Select_A/B_C.

The output of complement logic sub-block 43b is coupled to the complementary input node of master latch 45, while the output of true logic sub-block 43a remains coupled to the true input of master latch 45. It is preferred that true logic sub-block 43a and complement logic sub-block 43b be balanced such that both produce their respective outputs at substantially the same time. This eliminates a signal delay introduced by inverter 50 in the structure of FIG. 4. Since the present embodiment utilizes the true and complement of input signals, it is to be understood that it is well suited for receiving differential signals, such as used in current mode topologies.

For consistent performance, complement logic sub-block 43b is shown to be selectively enabled and disabled in unison with true logic sub-block 43a in accordance to signal Clock_C by virtue of switch device 51. That is, switch device 51 controls the enablement of the true and complement output of logic block 43 (i.e. true logic sub-block 43a and complement logic sub-block 43b).

Figure 6:
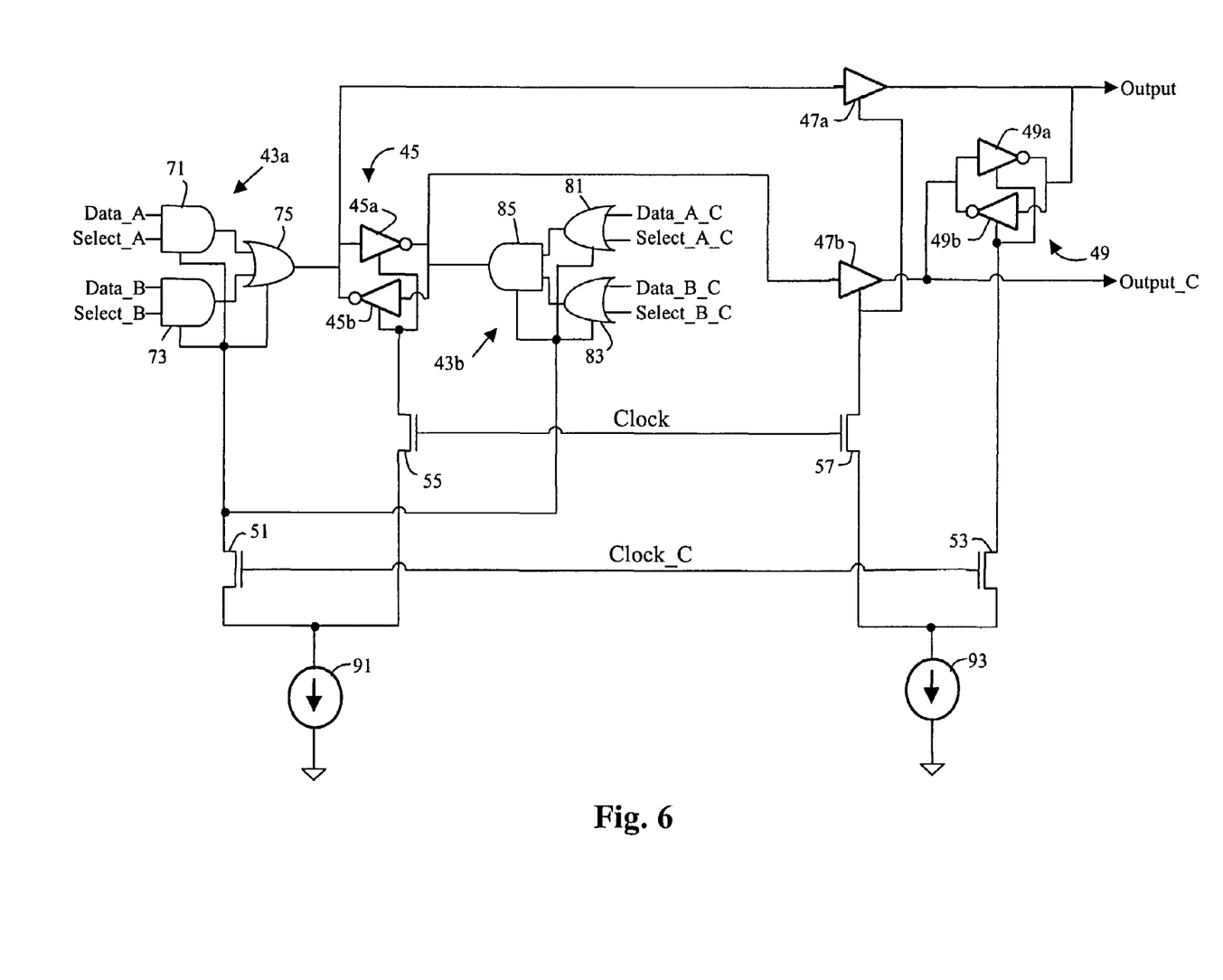
FIG. 6 is a block diagram of a CML implementation of the preferred hybrid flip-flop in accord with the present invention.

With reference to FIG. 6, all elements similar to those of FIGS. 3–5 have similar reference characters and are described above. The present embodiments shows a logic view of a CML implementation of a master-slave latch in accord with the present invention. In the present implementation, it is assumed that signal Select_A/B has either been resolved into two complementary signals, Select_A and Select B, or else replaced by two complementary signals, Select_A and Select B. Use of two separate signals simplifies its implementation in CML logic, since this provides their logic complements, Select_A_C and Select_B_C.

In the present implementation, a logic gate implementation of true logic sub-block 43a may consist of: a first AND gate 71 to receive signals Data_A and Select_A; a second AND gate 73 to receive signals Data_B and Select_B, and a an OR gate 75 to combine the output from AND gates 71 and 73. Each of AND gates 71 and 73 and OR gate 75 may be selectively placed in an active state or in an inactive state by virtue of switch device 51 and complementary signal Clock_C in manner similar to logic block 43a of FIGS. 3–5. Preferably, a logic high on signal Select_A indicates that signal Data_A is selected and signal Data_B is not selected. Similarly, a logic high on signal Select_B preferably indicates that signal Data_B is selected and signal Data_A is not selected. Thus as explained before, OR gate 75 outputs a logic high only if signals Data_A and Select_A are high or if signals Data_B and Select_B are high.

Conversely, the logic gate implementation of complement logic sub-block 43b may consist of: a second OR gate 81 to receive complementary signals Data_A_C and Select_A_C; a third OR gate 83 to receive complementary signals Data_B_C and Select_B_C; and a third AND gate 85 to combine the output from OR gates 81 and 83. Each of OR gates 81 and 83 and AND gate 85 may be selectively placed in an active state or in an inactive state by virtue of switch device 51 and complementary signal Clock_C in manner similar to complementary logic block 43b of FIG. 5. In accordance with the above explained requirement that compliment logic sub-block 43b output the logic compliment of true logic sub-block 43a, AND gate 85 outputs a logic low only if signals Data_A and Select_A are high or if signals Data_B and Select_B are high.

As stated above, the present embodiments is preferably a CML implementation of a master-slave latch, and true logic sub-block 43a, complement logic sub-block 43b, and master latch 45 are shown to be selectively coupled a first current source 91. True logic sub-block 43a, complement logic sub-block 43b and master latch 45 are active when they are coupled to current source 91 and are inactive when they are decoupled from current source 91. True and complementary logic sub-blocks 43a and 43b are selectively coupled to and decoupled from current source 91 in accordance with complementary signal Clock_C, and master latch 45 is selectively coupled to and decoupled from current source 91 in accordance with true signal Clock.

Similarly, slave latch 49 and coupling devices 47a and 47b are selectively coupled to a second current source 93. Slave latch 49 and coupling devices 47a and 47b are active when they are coupled to current source 93 and are inactive when they are decoupled from current source 93. Slave latch 49 is selectively coupled to and decoupled from current source 93 in accordance with complementary signal Clock_C. Coupling devices 47a and 47b are selectively coupled to and decoupled from current source 93 in accordance with true signal Clock.

Although not readily evident from the logic circuit structure shown in FIG. 6, the multiplexing operation of true logic sub-block 43a and complementary logic sub-block 43b may be readily incorporated into the circuitry structure of master latch 45. This incorporation of the multiplexing and latching operations permits them to be supplied by a single current source, 91. It is also to be noted that the signal transfer operation of the coupling devices 47a and 47b and the slave latch operation are both controlled by another single current source, 93. Therefore, the present implementation utilizes only two current sources, 91 and 93, as opposed to the three current sources required in the prior art implementation of FIG. 1. This results in a reduction in power consumption.

Although not shown for simplicity, it is to be understood that true logic sub-block 43a, complement logic sub-block 43b, master latch 45, coupling devices 45a and 47b, and slave latch 49 all incorporate some type of pull-up load device, as is common in CML topologies. This is more readily seen in FIG. 7.

Figure 7:
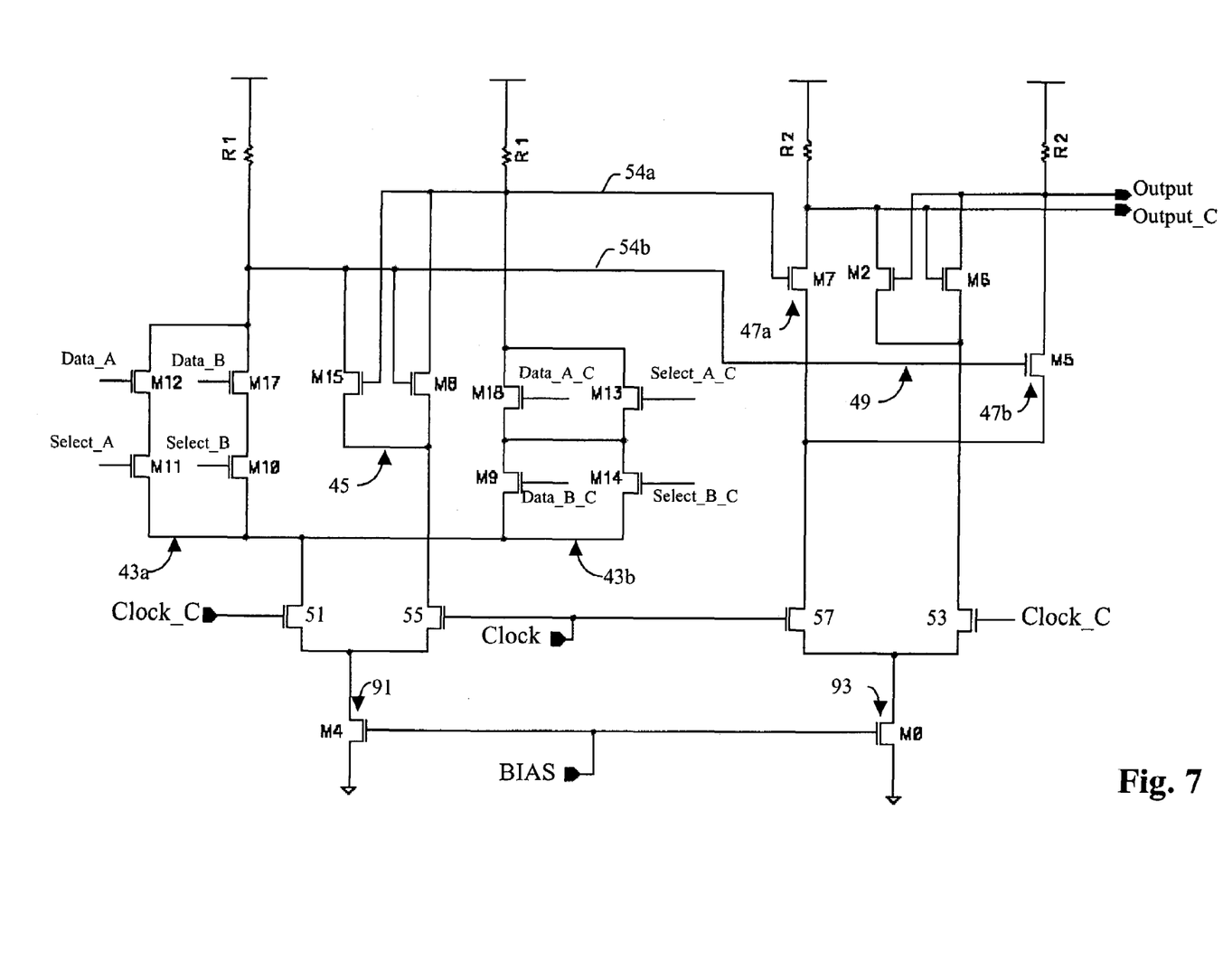
FIG. 7 is a transistor level diagram of the preferred CML implementation of the hybrid flip-flop in accord with the present invention.

With reference to FIG. 7, a transistor level implementation of the present invention incorporates loads R1 and R2. Load R1 provides a pull-up action for the multiplexing and master latch circuitry of the present hybrid master-slave latch, and load R2 provides a pull-up action for the slave latch circuitry and master-to-slave latch signal coupling circuitry of the present hybrid master-slave latch. All components similar to those of FIGS. 2–6 have similar reference characters and are described above.

The master latch 45 with integrated multiplexor 43a/43b and control circuitry is composed of transistors M11, M12, M10, M17, M15, M8, M18, M13, M9, M14, 51, 55, M4, and load R1. M4 embodies current source 91 and provides a constant current source when biased by an external voltage level labeled BIAS. The true side of the multiplexor (i.e. true sub-block 43a) is implemented by transistors M11, M12, M10, and M17 and the complement side (i.e. complement sub-block 43b) is implemented by transistors M18, M13, M9, and M14. Together, the true 43a and complement 43b sides of the multiplexor steer current from current source M4 (i.e. 91) through transistor 51 during the complement period, i.e. phase, of the clock (i.e. Clock_C). The differential Select signals are ANDed with the corresponding differential data signals to form the multiplexor function. The tracked data values appear on the master latch outputs 54a and 54b. At the rising edge of signal Clock, the tracked values are transferred to the cross-coupled common source pair M8, M15 keeping the data values on outputs 54a and 54b stable.

The slave latch 49 with coupling devices 47a and 47b and control circuitry is composed of transistors M5, M6, M2, M7, 53, 57, and M0 and load R2. Transistor M0 embodies current source 93, and provides a constant current in accordance to signal BIAS. The current from current source 93, i.e. transistor M0, is steered during the two phases of the clock by transistors 53 and 57. At the rising edge of signal Clock, transistors M7 and M5 transfer the value from outputs 54a and 54b from master latch 45 to the two outputs labeled Output and Output_C. Since the logic values of 54a and 54b are held stable by the signal Clock and transistors M15 and M8, the outputs of the flip-flop are stable. Slave latch 49 in accordance with complement signal Clock_C holds the outputs stable until the next rising edge of signal Clock. The outputs provide a differential value stable from one period of the clock signal to the next, whose value is equal to the value of the selected data input Data_A or Data_B at the rising edge of signal Clock.

In this manner, the master/slave differential flip-flop samples an incoming differential data input with a clock edge. The sampled data input is amplified and put on a first and second data output, wherein the first data output is the true value of the sampled input and the second data output is the complement of the sampled input. These values are held until the next clock edge of interest.

Not only does the present master-slave latch provides a multiplexor function on the data inputs that allows the selection of one of two sets of data by an input selection signal prior to the sampling of the data input by the flip-flop, in accordance with a clock edge, the multiplexor function is provided without any increased power over that of a basic flip-flop function. Therefore, the present latch provides for reduced power consumption as compared to the traditional use of separate and independent multiplexor and flip-flop circuits.

Additionally since the master latch 45 with the multiplexor function drives only the slave latch 49, various power/speed tradeoffs can be made. The current source transistors M0 and M4 can be of different size (i.e. have different current driving magnitudes) to provide less current to the master part of the circuit to reduce power while slightly increasing delay. Also the load resistors, R1, within the master part of the circuit can be of different size than the output loads resistors R2 within the slave part of the circuit to reduce the signal swing of the master part to further reduce power. That is, the voltage swing of the master latch output may be smaller than the voltage swing of the slave latch output.

Thus the present latch achieves its reduction in power consumption using two approaches. As explained above, the power of differential current steering logic such as CML is dependent on the number and current value of the current sources providing the steered current and on the total capacitance switched. Firstly, the power of the present hybrid multiplexor/flip-flop is reduced by decreasing the number of current sources from a traditional 3 current sources [one for the multiplexor and one each for the master latch and slave latch of a master-slave flip-flop] to 2 current sources by integrating the multiplexor function into the master latch of the flip-flop. Secondly, the integration of the two functions also reduces the switched capacitance since the total number of transistors switched is reduced.

Simulation studies of the present hybrid master-salve latch, or flip-flop, show that the present invention can achieve the same output delays as that of a traditional design using an independent multiplexor and latch, while consuming less power in the shift register application. This is likely due to the delay being due only to the slave latch delay. The tracking action of the master latch allows half a clock time for the data to appear on the master output before it affects the clock to data delay on the flip-flop output. The following table shows some results for the present embodiment in a 0.18 µm CMOS logic process at typical voltage (1.8 V) and room temperature (27C.).

| Parameter | Prior Art Latch | Present Embodiment Latch |
| --- | --- | --- |
| Static current | 7 mA | 2 mA |
| Clock-to-Output Delay in a 2.5 GHz shift register | 82 psec | 80 psec |
| Area of transistors | 600 µm² | 360 µm² |

As shown above, even while providing a shorter delay of 80 psec, as compared to 82 psec in a traditional multiplexer and latch combination, the present invention still consumes 71% less power and requires 40% less space (i.e. real estate on an IC) to implement. Although not shown in the table above, it is to be understood that the present latch could alternatively provide much faster operation at a power consumption level comparable to that of a traditional multiplexor and latch combination. As it is known, a reduction in real estate requirements reduces the overall cost of an IC. Thus, the present implementation not only improves the speed-to-power ratio of a CML latch, but also reduces the cost of its implementation in an IC.

The present invention has been described in connection with various preferred embodiments thereof with reference to the accompanying drawings.

However, various changes and modifications will be apparent to those skilled in the art based on the foregoing description. Such changes and modifications are intended to be included within the scope of the present invention to the extent they fall within the scope of the appended claims.

What is claimed is:

1. A master-slave latch comprising:
a data output;
a first data input;
a second data input;
a data select input for selecting one of said first and second data inputs and ignoring the other of said first and second data inputs;
a clock input, wherein said master-slave latch is effective for tracking a signal at the selected one of said first and second data inputs when said clock input is at a first logic state, and for transferring to said data output the tracked result when the clock input transitions from said first logic state to a second logic state;
wherein said master-slave latch is further effective for maintaining the transferred tracked result at said data output unchanged during a transition at said clock input from said second logic state to said first logic state;
a logic block coupled to receive said first data input, second data input, and data select input, said logic block being effective for outputting a predetermined logic state when said first data input is at said predetermined logic state and said data select input selects said first data input or when said second data input is at said predetermined logic state and said data select input selects said second data input, and for outputting a logic complement of said predetermined logic state otherwise, wherein said logic block is enabled when said clock input is at said first logic state and is disabled when said clock input is at said second logic state;
a first data latch couple to latch in the output from said logic block when enabled and for ignoring the output from said logic block when disabled, said first data latch being enabled when said clock input is at said second logic state and being disabled when said clock input is at said first logic state;
a data transfer device for transferring onto an intermediary output the latched-in contents of said first data latch when said clock input is at said second logic state and for blocking said first data latch from said intermediary output in response to said clock input being at said first logic state; and
a second data latch coupled to latch in and transfer to said a data output the data contents of said intermediary output when enabled, and effective for passing through without latching said intermediary output to said data output when disabled, said second latch being enabled when said clock input is at said first logic state and being disabled when said clock input is at said second logic state.

2. The master-slave latch of claim 1, wherein:
said first data latch includes a first inverter cross-couple to a second inverter;
said logic block is further effective for outputting said predetermined logic state at a node coupled to an input of said first inverter, and effective for outputting the logic complement of said predetermined logic state at a second node coupled to the input of said second inverter, whereby said first latch latches in both the true and complement output from said logic state circuit.

3. The master-slave latch of claim 2, wherein:
said intermediary output is a differential intermediary output having a true intermediary output node and a complement intermediary output node;
said data transfer device includes a first logic buffer coupling the output from one of said first and second inverters to said true intermediary output node, and includes a second logic buffer coupling the output from the other of said first and second inverters to said complement intermediary output node.

4. The master-slave latch of claim 3, wherein:
said a data output is a differential data output having a true data output node and a complementary data output node;
said second data latch includes a third inverter cross-couple to a fourth inverter;
said true intermediary output node is coupled to the input of one of said third and fourth cross-coupled inverters and to said true data output node;
said complementary intermediary output node is coupled to the input of the other of said third and fourth cross-coupled inverters and to said complementary data output node.

5. The master-slave latch of claim 4, wherein said logic block includes a true logic sub-block for outputting said predetermined logic and a complementary logic sub-block for outputting the complement of said predetermined logic.

6. The master-slave latch of claim 4, wherein said master-slave latch is a current mode logic circuit, and wherein:
said first and second cross-coupled inverters includes:
a first pull-up device in series with a first switch device, said first switch device being selectively coupled and decoupled from a current source in response to said clock input; and
a second pull-up device in series with a second switch device, said second switch device being selectively coupled and decoupled from said current source in response to said clock input;

wherein said first switch device is responsive to the junction between said second pull-up device and second switch device, and said second switch device is responsive to the junction between said first pull-up device and said first switch device; and
said logic block includes a first pair of series-connected switching devices and a second pair of series-connected switching devices, said first and second pairs being coupled in parallel and selectively coupled from said first pull-up device to said current source in response to said clock input.

7. The master-slave latch of claim 6, wherein:
one of the switching devices in said first pair is responsive to said first data input and the other of the switching devices in said first pair is responsive to said data select input; and
one of the switching devices in said second pair is responsive to said second data input and the other of the switching devices in said second pair is responsive to the logic complement of said data select input.

* * * * *